(12) United States Patent
Young

(10) Patent No.: US 6,424,154 B1
(45) Date of Patent: Jul. 23, 2002

(54) MAGNETIC RESONANCE IMAGING APPARATUS

(75) Inventor: Ian Robert Young, Marlborough (GB)

(73) Assignee: Koninklijke Philips Electronics N.V. (NL)

( * ) Notice: Subject to any disclaimer, the term of this patent is extended or adjusted under 35 U.S.C. 154(b) by 0 days.

(21) Appl. No.: 09/685,539

(22) Filed: Oct. 10, 2000

(30) Foreign Application Priority Data

Oct. 9, 1999 (GB) .............................................. 9923797

(51) Int. Cl.$^7$ ................................................. G01V 3/00
(52) U.S. Cl. ......................... 324/318; 324/319; 324/309
(58) Field of Search ................................. 324/318, 319, 324/320, 309, 307, 300

(56) References Cited

U.S. PATENT DOCUMENTS

| | | | |
|---|---|---|---|
| 4,665,368 A | 5/1987 | Sugiyama et al. | ........... 324/309 |
| 4,812,753 A | 3/1989 | Fuderer et al. | ............. 324/309 |

FOREIGN PATENT DOCUMENTS

| | | |
|---|---|---|
| EP | 0 412 824 | 2/1991 |
| GB | 2 251 491 | 8/1992 |

*Primary Examiner*—Edward Lefkowitz
*Assistant Examiner*—Brij B. Shrivastav
(74) *Attorney, Agent, or Firm*—John J. Fry; Thomas M. Lundin

(57) ABSTRACT

The image produced by a magnetic resonance imaging apparatus using a receive coil 2 has inaccuracies due to external circumstances which affect the signal produced by the coil 2. Thus, noise spikes affect the signal, although more usually extensive shielding is provided. Also, changes of loading of the coil produced by movement of the patient vary the Q of the coil and hence the signal output. In accordance with a first aspect of the invention, a second coil 4 superimposed on the coil 2 is tuned to a frequency offset compared to the MR center frequency and is used to monitor coil loading to enable the signal from coil 2 to be corrected, and in accordance with a second aspect of the invention an additional coil 4 or 8, preferably both, is/are provided in order to detect broadband noise and enable its suppression on the output of the coil 2.

21 Claims, 2 Drawing Sheets

MAGNETIC RESONANCE IMAGING APPARATUS

BACKGROUND

This invention relates to magnetic resonance (MR) imaging apparatus.

Such apparatus includes a magnet for producing a main magnetic field in an examination region in which magnetic resonant active nuclei such as protons (hydrogen atoms) precess about the main magnetic field at a so-called Larmor frequency. An excitation pulse of RF energy at the Larmor frequency applied via a transmit coil in or surrounding the examination region excites such nuclei to resonance, and the resulting RF signals emitted by them are received by means of an RF receive coil. In some circumstances the same coil may be used for transmit and receive.

Data representing the spatial distribution of the excited nuclei, which represents the spatial distribution of tissue, can be collected by spatial encoding of the main magnetic field during excitation and during reception. From such data a two-dimensional or three-dimensional image of the part of the patient under examination can be built up.

The receive coil is tuned to the Larmor frequency at which the main magnetic resonant active nuclei are excited, and typically the coil has a high Q (quality factor) given by:

$$Q = \frac{\omega L}{r},$$

where $\omega$ is the angular frequency to which the coil is tuned, L is its inductance, and r its effective resistance.

When loaded by the body of the patient, which tends to be conductive because of its watery nature, the effective resistance is increased and Q is accordingly decreased, perhaps by as much as 80% of its unloaded value.

A typical Q for a receive coil would lie in the range of from 10 to 100, when loaded. Such a high Q is necessary in view of the minute nature of the MR signal to be received. However, such a sensitive coil is more responsive to external disturbing factors, which can result in inaccuracies or inconsistencies in the data set, which would show up as spurious features (known as artefacts) on the final image.

It is for this reason that MR imaging apparatus has to be so carefully shielded. A typical specification of a room housing an MR machine is 120 dB rejection of RF frequencies in the band of interest. This actually adds a considerable amount to the financial outlay required to install an MR machine.

Another consequence of the high Q of the RF receive coil is that inconsistencies in a data set can be caused. Movement of the body, including that due to respiration, affects the loading of the coil, as more or less water-based material moves into and out of the vicinity of the coil. In fact, the variation of the signal with such movement is a relatively complicated matter, since the signal received by the coil when the body moves towards it is reduced according to the square root of the (decreased) Q of the coil but is increased in linear fashion according to the filling factor. The filling factor depends on how close the region to be imaged is to the receive coil. For a coil close to the body (a close-coupled coil), however, small changes in position have a much greater impact on Q than on the filling factor. (The converse is true if the coil is some way away from the body).

The variation of loading applies whether the receive coil is a large coil surrounding the body (a whole body coil), a coil placed on the surface of a region of interest of the patient (a surface coil) or a small internal coil such as those used in or with endoscopes, including flexible versions such as gastroscopes or colonoscopes. Especially with the latter, coil motion is hard to prevent relative to the volume to be imaged.

SUMMARY OF THE INVENTION

The invention provides magnetic resonance imaging apparatus, comprising a first RF coil for receiving magnetic resonance (MR) signals to enable an image to be produced, and an additional RF coil for receiving signals which provide data about the signal received by the first RF coil.

The additional coil enables an indication to be provided if a variation of the signal received by the first RF coil is due to external disturbances or patient movement.

The additional RF coil may be arranged to detect noise transients and/or may be tuned to the frequency of a reference transmitter, to enable the signal output of the first RF coil to be corrected for changes in Q of the coil due to movement of the patient. The additional RF coil is preferably superimposed on the first RF coil. A second additional RF coil may be provided, which also may be superimposed on the first RF coil, to enable broadband noise spikes to be detected in conjunction with the first additional RF coil.

BRIEF DESCRIPTION OF THE DRAWINGS

Magnetic resonance imaging apparatus constructed in accordance with the invention will now be described in detail, by way of example, with reference to the accompanying drawings, in which.

DETAILED DESCRIPTION

Figure 1:
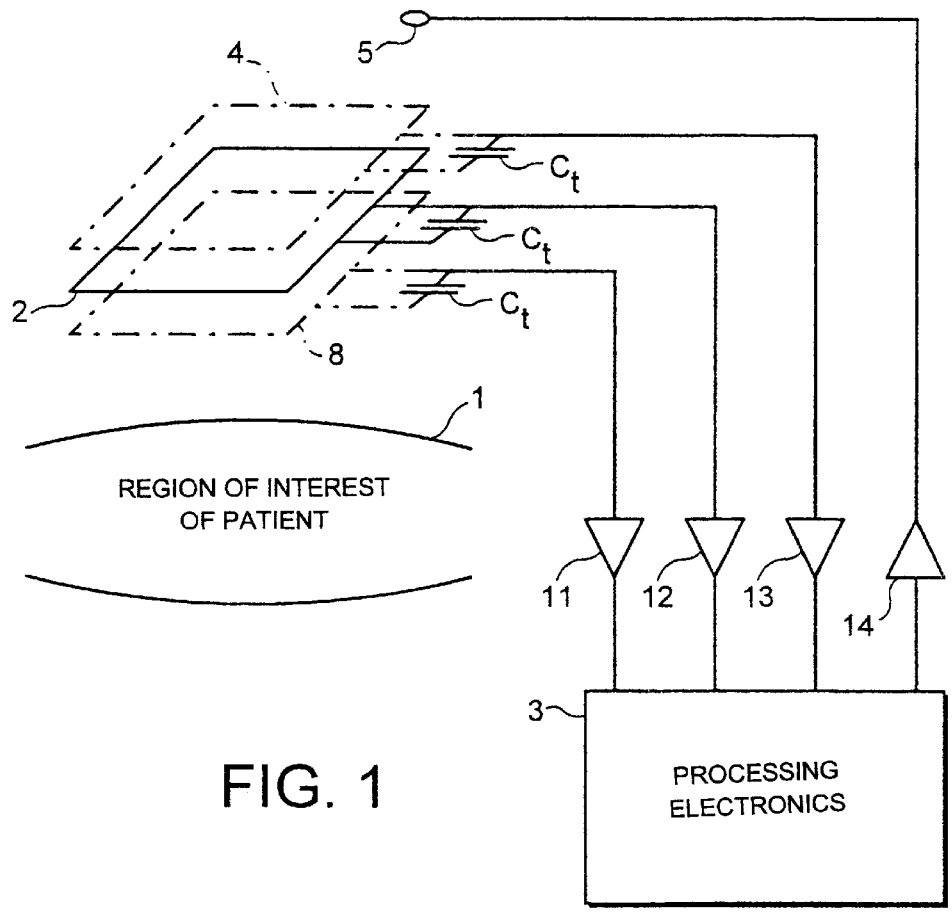
FIG. 1 is a schematic view of the magnetic resonance imaging apparatus partly in perspective.

Referring to FIG. 1, a region of interest of a patient 1 is positioned in the main magnetic field of a powerful magnet (not shown) such as a superconducting magnet. The patient may be slid into the bore of such a superconducting magnet until the region to be imaged lies in a region of uniform field of the main magnet. An RF coil (not shown) surrounding the patient applies RF excitation pulses, and the resulting MR signals are received by a first RF coil 2 which is connected to one channel of processing electronics 3. The processing electronics drive a display (not shown) on which an image of a slice, or several slices, of a region of interest of the patient can be displayed.

In order to encode the MR signals collected by the coil 2, gradients are set up in the main magnet both during excitation by the transmit coil and also during collection of the resulting MR signals.

According to a first aspect of the invention, the RF receive coil 2 is accompanied by an additional RF receive coil 4 superimposed on the receive coil 2. This additional RF receive coil is also connected to a channel of the processing electronics 3.

The additional RF coil 4 does not play any part in the imaging of the patient, which is undertaken only using coil 2. In fact, coil 4 is tuned to a much higher frequency than that to which coil 2 is tuned.

Figure 3:
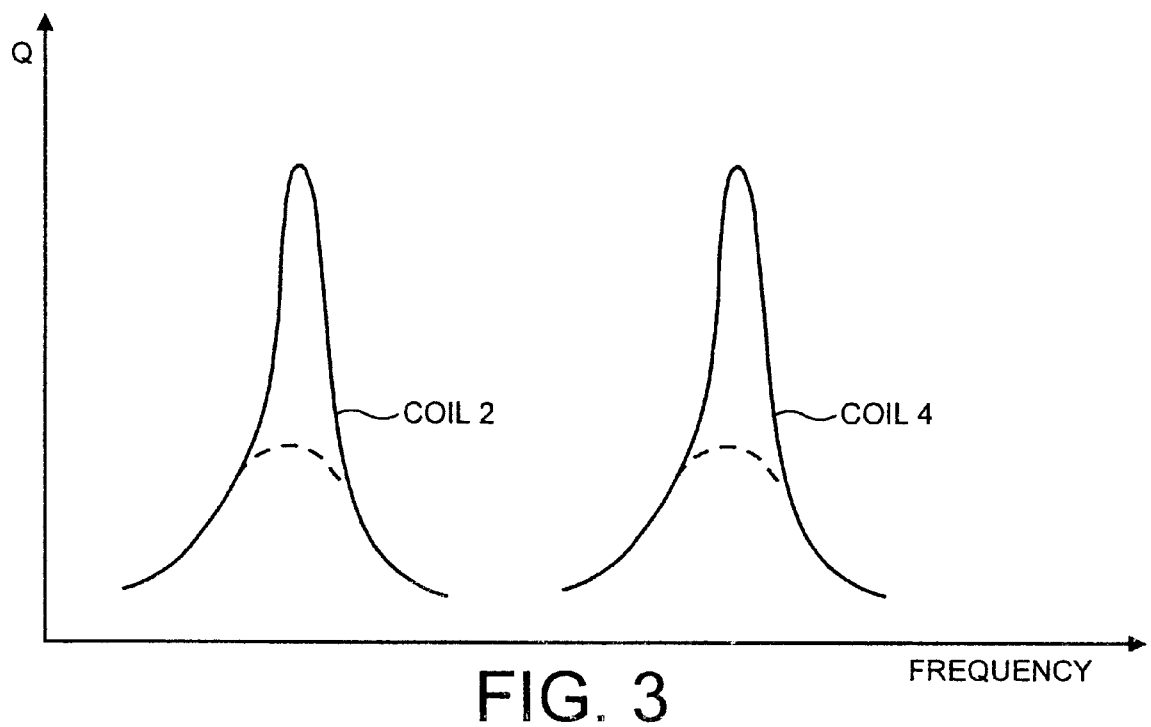
FIG. 3 is a graph illustrating the variation with frequency of the Q of a first pair of receive coils.

Referring to FIG. 3, the full line left-hand resonance curve is the Q of the first RF receive coil 2, while the second full line curve is the Q of the additional RF coil 4. In each case, the dotted line shows the change in the Q curve produced by an increased loading of the coils 2 and 4 by the region of the human body being imaged, by virtue of the increase in the effective resistance of the respective coils.

Referring to FIG. 1, a low powered RF source in the form of a probe coil 5, the output of which can be precisely controlled, is located as far as practicable from the body, and provides a reference signal at the frequency to which the coil 4 is tuned. This source transmits continuously or on command, as required, but at a constant level. Consequently, the output channel connected to the coil 4 monitors the variation of Q of the coil 4 produced by variation in its loading as the patient moves. Because the coil 2 is coincident with the coil 4, its Q can be assumed to vary in the same fashion, and a knowledge of how the output of coil 4 has varied during a scan is used to make corrections to the variation in the signal received by the coil 2 during the scan which will also take place.

Variations in Q will result in variations in the signal detected by the reference coil 4, and the inverse of the ratio of this signal to a reference derived at the start of the study may be used as a multiplier for the observed signal from the detector coil 2 to produce the corrected signal.

Thus, if the signal received from the first RF coil 2 is denoted as $S_{NMR\ observed}$, the value of the signal after correction for the variation of Q is $S_{NMR\ corrected}$, the signal received by the coil 4 at the outset of measurements is $S_{0\ ref}$ and the value of the signal during a scan is $S_{ref\ observed}$, then the variation of Q of the coil 2 can be corrected according to the following equation:

$$S_{NMR\ true} = S_{NMR\ observed} \times \frac{S_{0\ ref}}{S_{ref\ observed}}.$$

Figure 2:
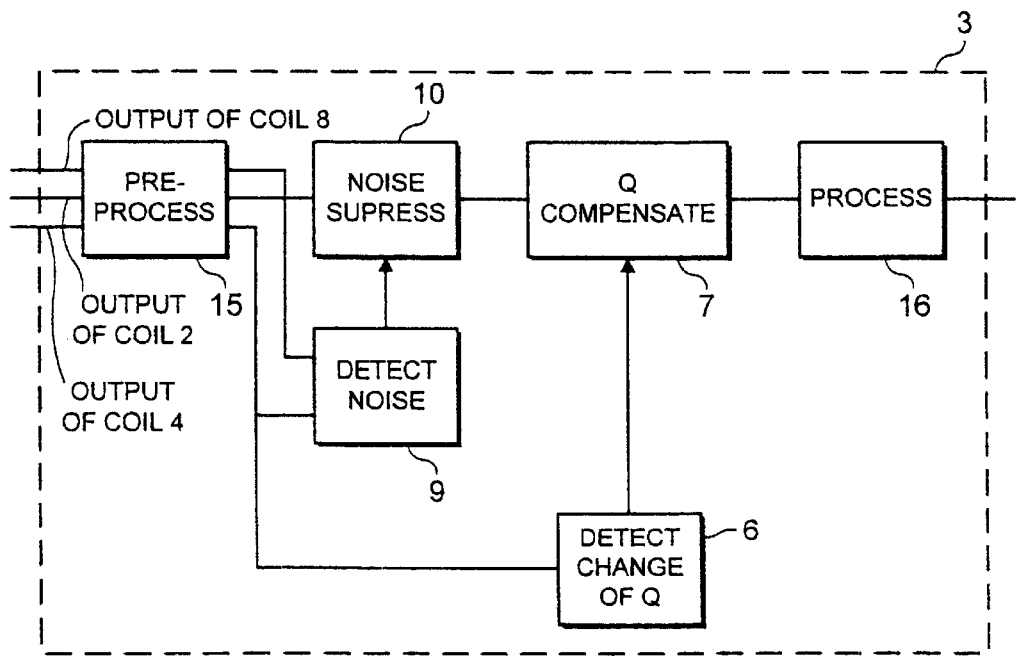
FIG. 2 is a block diagram of the processing electronics of the magnetic resonance imaging apparatus of FIG. 1.

Referring to FIG. 2, the processing electronics 3 includes a sub-unit 6 which continuously receives the output of the coil 4, and into which the reference value of the output of the coil 4 is periodically loaded, for example at the start of each scan. Sub-unit 7 then has the information necessary to compensate the signal from the output of the first reference coil 2.

As shown in FIG. 3, the coil 4 has the same value of Q as coil 2 has, but this is not necessary. For example, coils 2 and 4 could have different numbers of turns and the peak of one Q curve could be different from the peak of the Q curve of the other coil.

Typical values for the frequencies to which the coils 2 and 4 could be tuned are 42.6 MHz and 100 MHz, respectively. Generally, the difference between the centre frequency of the additional coil 4 and the first coil 2 may be at least 2 MHz, preferably at least 5 MHz and may exceed 50 MHz, and the coil 4 is tuned to the higher frequency, but could if desired be tuned to the lower. The coil 2 may be tuned to any frequency within the range of 5 to 300 MHz. The main magnet may have a field strength of 1.0 T (Tesla), but the method is applicable to any value of main magnetic field strength.

Using a high reference frequency means that the reference system sensitivity is high. This is useful at low magnetic field where the extrapolation from one frequency of operation to the other may be greater, but over the fairly limited range of variation of Q that is actually encountered, the larger variations in reference signal obtainable at higher frequencies if used for the reference allow for more precise adjustments. The body affects sensitivities in an approximately quadratic function of frequency. Higher frequencies therefore allow for greater sensitivity.

Figure 4:
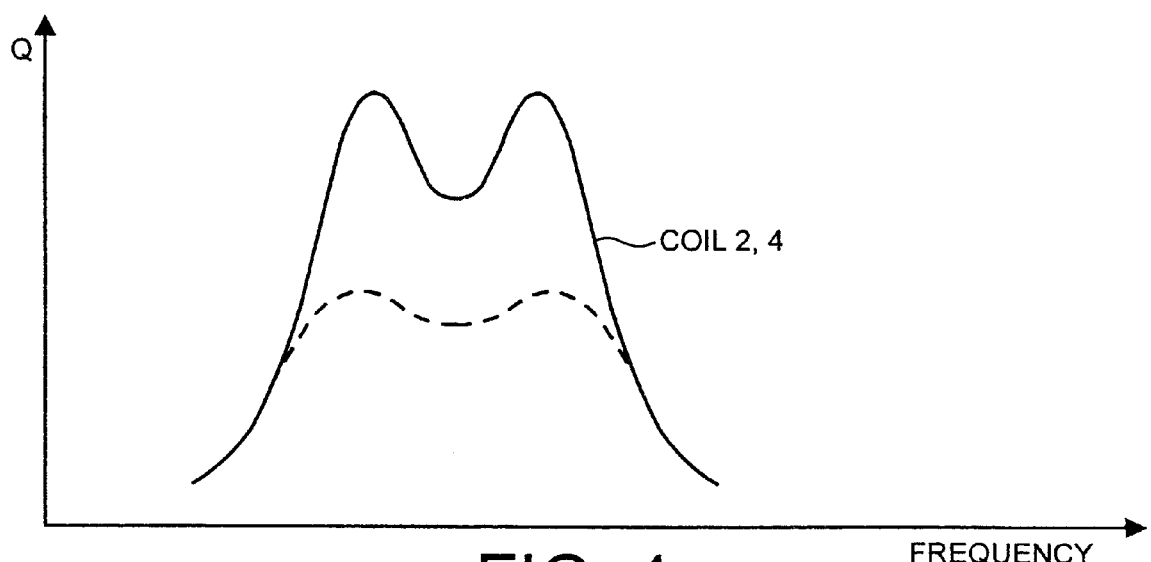
FIG. 4 is a graph illustrating the variation with frequency of the Q of a second pair of receive coils.

Keeping the reference frequency close to that of the resonance is philosophically attractive, since this makes the behaviour of the reference more like that of the actual detector, but the coils have to be tuned together, and their responses split as shown in FIG. 4, and then there is significant direct coupling of the response of one coil into the response of the other.

In this case, with an alternative, second pair of coils 2, 4, the offset between the frequencies to which the coils 2, 4 are tuned is very small, for example in the region of 100 kHz–500 kHz, preferably 100 kHz–200 kHz. Again, the additional coil is tuned to the higher frequency, but could be tuned to the lower if desired. In this case, both coils will be coupled and their Qs will both be of the form shown in FIG. 4. The signal produced by the source will still not interfere to too great an extent with the MR signals picked up by the coil 2, and the method of correction of the signal from the output of the coil 2 will be as described for the first form of coils 2, 4. The coil 2 may be tuned to any frequency within the region of 5 to 300 MHz.

For both the first and second form of coils 2, 4, the power of the reference source 5 may be in the ratio of between 10:1 and 1000:1 with reference to the strength of the MR signals picked up by the coil 2, i.e. proportionately greater by those amounts.

According to a second aspect of the invention, a third coil 8 is provided, also arranged coincident with the coils 2 and 4. This coil is set to a much lower frequency than the first RF coil 2. For example, in the case of both forms of coil 2, 4 described above, the resonant frequency of the coil 8 could be 10 MHz.

Noise spikes in the main are broadband, and if a similar noise signal is detected by both coils 8 and 4, the presence of an identical noise spike on the signal from the first RF coil 2 can be suppressed. This is performed in blocks 9 and 10 of the processing electronics. Noise suppression can be implemented either by deleting the affected data and instructing the system to re-acquire it if the change is substantial, or by interpolation from surrounding good quality data if the change is very limited.

In accordance with usual practice, the coils 2, 4 and 8 are all provided with tuning capacitors Ct, and the outputs of the coils 2, 4 and 8 are provided with respective pre-amplifiers 12, 13 and 11, while transmitter 5 also has an amplifier 14.

In accordance with usual practice, the signals received from the coils 2, 4 and 8 are down converted and digitised (pre-process block 15), so that the corrections of the noise suppression 10 and Q compensation 7 take place in the digital domain. Once the output of the coil 2 has been corrected, processing takes place in block 16 in the usual way, and the output feeds a display (not shown).

While specific processing blocks have been shown for the noise suppression and Q compensation in FIG. 2, in fact these functions could be carried out entirely in software.

Variations may of course be made without departing from the scope of the invention. Thus, the Q compensation aspect of the invention may be omitted, and the three coils 2, 4 and 8 may be used simply to suppress noise, in order to enable the noise rejection specification of the room housing the MR machine to be relaxed. Equally, the noise suppression aspect may be omitted, and the MR apparatus may simply compensate for the variation of Q of the coil 2 on loading only, coil 8 and processing blocks 9, 10 being omitted.

What is claimed is:

1. An RF coil system for use in magnetic resonance imaging, said RF coil system comprising:

a first RF coil tuned to a first frequency for receiving magnetic resonance signals from an object and generating an output signal indicative of the magnetic resonance signals;

means for transmitting a reference RF signal at a second frequency, the second frequency being different from the first frequency;

a second RF coil tuned to the second frequency; and means operatively connected to the first and second RF coils for correcting variations in the output signals generated by the first RF coil.

2. An RF coil system according to claim 1 wherein the first RF coil is a surface coil.

3. An RF coil system according to claim 2 wherein the second RF coil is superimposed on the first RF coil.

4. An RF coil system according to claim 1 wherein the second frequency differs from the first frequency by at least 2 megahertz.

5. An RF coil system according to claim 1 wherein the second frequency differs from the first frequency by a frequency in the range of 100 to 500 kilohertz.

6. An RF coil system according to claim 1 further comprising a third RF coil tuned to a third frequency, the third frequency being different from the first and second frequencies.

7. An RF coil system according to claim 6 further comprising means operatively connected to the first, second, and third RF coils for suppressing noise signals received by the first RF coil.

8. A method of correcting errors in magnetic resonance imaging signals, comprising:

generating an RF reference signal at a second frequency;

receiving a first RF reference value using a second RF coil, the second RF coil being tuned to the second frequency;

exciting magnetic resonance in an object;

receiving magnetic resonance signals from the object using a first RF coil, the first RF coil being tuned to a first frequency;

generating an output signal indicative of the magnetic resonance signals received from the object by the first RF coil;

receiving a second RF reference value using the second RF coil; and correcting the output signal generated by the first RF coil using the first and second reference values received by the second RF coil.

9. A method according to claim 8 wherein the output generated by the first RF coil are corrected according to the following equation:

$$S_{NMR\ true} = S_{NMR\ observed} \times (S_{0\ ref} / S_{ref\ observed})$$

where $S_{NMR\ true}$ is the corrected output, $S_{NMR\ observed}$ is the output generated by the first RF coil, $S_{0\ ref}$ is the first RF reference value received by the second RF coil, and $S_{ref\ observed}$ is the second RF reference value received by the second RF coil.

10. A method according to claim 8 wherein the difference between the first and second frequencies is at least 2 megahertz.

11. A method according to claim 8 wherein the difference between the first and second frequencies is in the range of 100 to 500 kilohertz.

12. A method according to claim 8 wherein the second RF coil is superimposed on the first RF coil.

13. A method according to claim 8 further comprising:

receiving signals using a third RF coil, the third RF coil being tuned to a third frequency; and suppressing noise received by the first RF coil using signals received by the second and third RF coils.

14. A method according to claim 8 wherein the errors are due to changes in quality factor of the first RF coil.

15. An RF coil system for use in magnetic resonance imaging, said RF coil system comprising:

a first RF coil tuned to a first frequency for receiving magnetic resonance signals from an object and generating an output signal indicative of the magnetic resonance signals;

a second RF coil tuned to a second frequency, the second frequency being higher than the first frequency;

a third RF coil tuned to a third frequency, the third frequency being lower than the first frequency; and means operatively connected to the first, second, and third RF coils for suppressing noise signals received by the first RF coil.

16. An RF coil system according to claim 15 further comprising a coil for providing a reference RF signal at the second frequency.

17. An RF coil system according to claim 16 further comprising means operatively connected to the first and second RF coils for correcting variations in the output signal generated by the first RF coil.

18. An RF coil system according to claim 17 wherein the variations in the output signals generated by the first RF coil are due to motion of the object.

19. An RF coil system according to claim 15 wherein the first RF coil is a surface coil.

20. An RF coil system according to claim 19 wherein the second and third RF coils are superimposed on the first RF coil.

21. An RF coil system according to claim 15 wherein the noise received by the first RF coil is broadband noise, the broadband noise also being received by the second and third RF coils.

* * * * *